United States Patent [19]
Chi

[11] 3,955,102
[45] May 4, 1976

[54] ZERO CROSSING DETECTING CIRCUIT

[75] Inventor: Chao S. Chi, Shrewsbury, Mass.

[73] Assignee: Digital Equipment Corporation, Maynard, Mass.

[22] Filed: Apr. 21, 1975

[21] Appl. No.: 570,309

Related U.S. Application Data

[63] Continuation of Ser. No. 417,995, Nov. 21, 1973, abandoned.

[52] U.S. Cl. .................... 307/235 E; 307/235 N; 328/147
[51] Int. Cl.² ........................................ H03K 5/153
[58] Field of Search ........ 307/235 R, 235 N, 235 P; 328/146–149

[56] References Cited
UNITED STATES PATENTS

| | | | |
|---|---|---|---|
| 3,122,729 | 2/1964 | Bothwell et al. | 328/148 X |
| 3,600,606 | 8/1971 | Clor, Jr. | 307/235 |
| 3,600,607 | 8/1971 | Vatin | 307/235 |
| 3,743,946 | 7/1973 | Gass et al. | 328/147 X |
| 3,784,921 | 1/1974 | Iadipaolo | 328/146 X |
| 3,873,853 | 3/1975 | Ahmed | 307/235 N |
| 3,877,025 | 8/1975 | Maio | 307/235 N X |

OTHER PUBLICATIONS

Hoskins, "Crossover Detector"; IBM Tech. Discl. Bull.; Vol. 14, No. 3, pp. 934; 8/1971.

*Primary Examiner*—John S. Heyman
*Assistant Examiner*—L. N. Anagnos
*Attorney, Agent, or Firm*—Thomas C. Siekman

[57] ABSTRACT

A zero-crossing detecting circuit where the input signal is applied to positive and negative threshold circuits. Each threshold circuit is connected to the input of a respective one-shot circuit which responds to the beginning edge of each output signal from its threshold circuit. The output pulses of both one-shots are applied to a NOR circuit which thereby responds to the beginning edges but not the trailing edges of the signals from the threshold circuits. Accordingly, variations in the trailing edges of the signals from the threshold circuits due to hysteresis or varying propogation times do not effect the circuit's output.

5 Claims, 2 Drawing Figures

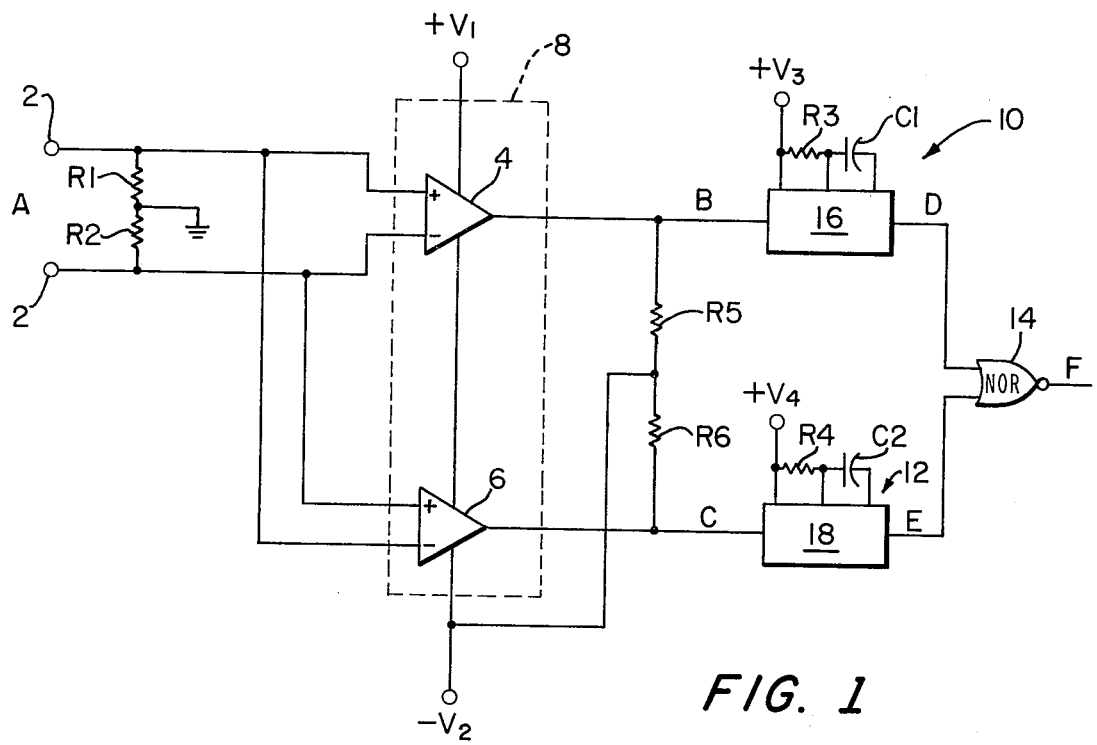
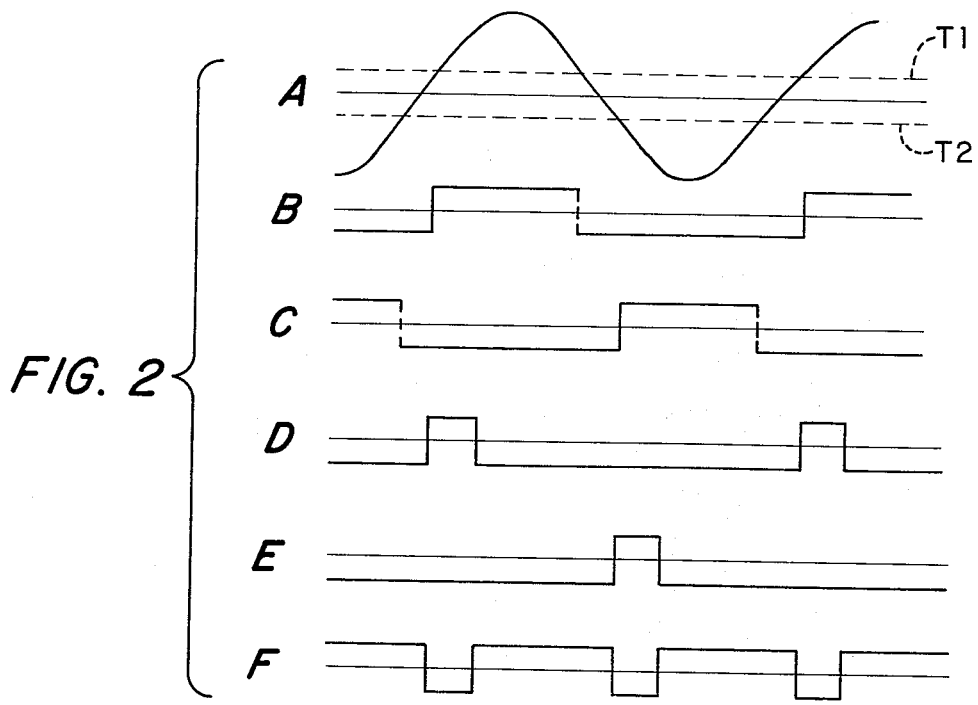

ZERO CROSSING DETECTING CIRCUIT

CROSS REFERENCE TO RELATED APPLICATION

This is a continuation of Ser. No. 417,995 filed Nov. 21, 1973, entitled "Zero Cross Detecting Circuit", and now abandoned.

BACKGROUND OF INVENTION

This invention relates to a zero-crossing circuit and, in particular, to a zero-crossing circuit which is particularly adapted for reading information recorded on a magnetic disk or tape.

When informaton is read from a magnetic disk, tape or similar magnetic surface storage element, the magnetic head reading the information provides analog voltage signals which may indicate the data being read by crossing a zero voltage or other reference. A zero-crossing circuit is thus used to receive the output of the magnetic head and indicate the data. Such zero-crossing circuits often contain threshold circuits which provide signals when the input signal goes above or below predetermined voltage thresholds. Consequently, hysteresis within the threshold circuits, differences between the turn-off and turn-on voltage thresholds, can cause errors in reading the data.

SUMMARY OF INVENTION

According to the invention, a zero-crossing circuit is provided which includes positive and negative threshold circuits for receiving the input signal. The positive threshold circuit provides a signal when the input signal is above a predetermined threshold with the negative threshold circuit providing a signal while the input signal is below a predetermined negative threshold which, in absolute value, is equal to the positive threshold. Each threshold circuit is connected to a respective one-shot circuit which sets in an active state for a predetermined period in response to the beginning edge of the signal from its respective threshold circuit. The outputs of both one-shot circuits are connected to a gating circuit which provides an output pulse in response to either one-shot circuit being in an active state.

Consequently, the output provided by the gating circuit is dependent only on the beginning edges of the signals from the threshold circuits. The turn-on thresholds affecting these beginning edges may be set to precisely the same absolute value by fabricating both threshold circuits on the same chip. Since the turn-on thresholds of the two threshold circuits are equal and the output of the gating circuit does not depend on the trailing edges of the signals from the threshold circuits, the output from the circuit signal is not effected by any variations in the trailing edges of the threshold signals due to hysteresis or due to varying propogation delay times. The zero-crossing circuit indicates each zero-crossing although each such indication is delayed for a predetermined time (depending on the value of the turn-on thresholds).

BRIEF DESCRIPTION OF THE DRAWING

FIG. 1 is a circuit diagram of a preferred embodiment of the invention.

FIG. 2 shows illustrative wave forms which occur at the designated locations in FIG. 1.

DETAILED DESCRIPTION OF THE PREFERRED EMBODIMENT

With reference to FIGS. 1 and 2, an analog input signal A is applied to input terminals 2. The input signal A may be, for example, obtained from a magnetic head sensing data recorded on a magnetic disk or tape. The input signal is applied to a dual complementary voltage comparator 8 comprising a pair of analog comparators, 4 and 6, formed by a single integrated circuit. The analog comparators 4 and 6 receive the input signal A on their opposing positive and negative inputs and so operate in a complementary manner with respect to each other. The voltage comparator is connected to supply voltages +V1 and −V2 as indicated in the drawing. Biasing resistors R1 and R2 are connected across the input terminals 2.

The analog comparator 4 acts as a positive voltage threshold circuit and provides a positive signal B initiated whenever the analog signal A rises above its threshold T1. The positive signal B terminates in response to the input signal going below the positive threshold of comparator 4. Similarly, analog comparator 6 with its negative voltage threshold T2, provides a positive signal C whenever the input signal A goes below its negative threshold voltage level and terminates when the input signal goes above the negative threshold level.

The analog comparators 4 and 6 have their thresholds equal in absolute value. The dual comparator 8 is fabricated on a single integrated chip so that the turn-on thresholds of analog comparators 4 and 6 are made equal. The dual comparator 8 is an easily available item such as part no. MC1414 from Motorola Semiconductor Products, Inc.

The outputs of the comparators 4 and 6 are applied to respective one-shot circuits 10 and 12. One-shot 10 provides a positive pulse of a predetermined duration in response to the leading edge of each positive signal B from the analog comparator 4. One-shot 12 provides a positive pulse of like predetermined duration in response to the leading edge of each signal C from comparator 6.

As shown, the one-shot 10 comprises an integrated circuit 16 (as Part No. Sn4121 from Texas Instruments Incorporated) connected to a supply voltage +V3, resistor R3 and capacitor C1 as indicated. The output pulse provided is dependent on the R3C1 time constant. Similarly, one-shot 12 comprises an identical integrated circuit 18 connected to a supply voltage +V4, resistor R4 and a capacitor C2 in the same manner and of the same values as their respective corresponding elements within one-shot 10. Accordingly, one-shot 10 and 12 when activated provide pulses of the same duration.

As shown, resistors R5 and R6 are connected in series across the inputs of the two one-shots with their center tap connected to voltage −V2 to pull sink current as is recommended by the comparator's 8 manufacturer.

The outputs of both one-shots 10 and 12 are connected to the inputs of a NOR gate 14. As indicated by waveforms D, E, and F which respectively designate pulse trains from one-shots 10 and 12 and NOR gate 14, in response to the leading edge of each positive pulse from the one-shots, a negative pulse is provided by the NOR gate.

As can be seen from an inspection of FIG. 2, in the preferred embodiment disclosed, the output of NOR gate 14 comprises negative pulses (waveform F) whose positive-to-negative leading-edge transitions indicate the negative-to-positive leading-edge transitions from the dual comparator 8 indicating zero-crossings in the input signal A. Since the circuit only responds to the beginning of the signals from the dual comparator 8, variations in the trailing edges of these positive signals from the comparator 8 due to its inherent hysteresis or due to differences in signal propogation times within the comparator do not effect the circuit's output. As long as the threshold levels of analog comparators 4 and 6 are equal in absolute value, the leading-edges in the train of negative pulses from NOR 14 will correspond to the zero-crossings which occur in the input signal A. However, such leading-edges in the output signal are delayed a predetermined amount from the zero-crossings depending on the value of the turn-on thresholds of the comparators 4 and 6.

Of course, by setting the thresholds T1 and T2 of the comparators 4 and 6 at a higher value, the circuit will perform as a voltage level detector with a pulse occurring in output waveform F in response to each time the voltage of input signal A goes above or below the threshold value of comparators 4 and 6.

I claim:

1. A circuit for indicating zero-crossings in an input signal comprising:

first means for receiving said input signal and providing a signal when said input signal is above a predetermined positive threshold level;

second means for receiving said input signal and providing a signal when said input signal is below a predetermined negative threshold, equal to said positive threshold;

a pair of one-shot circuits respectively connected to said first and second means, each one-shot circuit being adapted to become placed in the active state in response to the beginning of the signal from its respective first or second means; and an output gating circuit connected to each one-shot circuit and adapted to provide a signal in response to either one-shot circuit becoming placed in an active state, each response of said output gating circuit indicating a zero-crossing in the input signal.

2. The circuit as recited in claim 1 wherein said input signal is an analog voltage.

3. The circuit as recited in claim 1 wherein said first and second receiving means are a pair of analog comparators fabricated on a single integrated chip.

4. The circuit as recited in claim 1 wherein said output gating circuit is a NOR gate.

5. The circuit is recited in claim 1 wherein said first and second means possess inherent characteristics which cause variations in the ends of their respective signals.

* * * * *